United States Patent [19]

Iga et al.

[11] Patent Number: 5,289,486
[45] Date of Patent: Feb. 22, 1994

[54] SEMICONDUCTOR LUMINOUS ELEMENT AND SUPERLATTICE STRUCTURE

[75] Inventors: Kenichi Iga, Machida; Fumio Koyama, Hino; Takeshi Takagi, Ibaraki, all of Japan

[73] Assignee: Omron Corporation, Kyoto, Japan

[21] Appl. No.: 55,799

[22] Filed: Apr. 29, 1993

Related U.S. Application Data

[63] Continuation of Ser. No. 841,991, Feb. 27, 1992, abandoned.

[30] Foreign Application Priority Data

Feb. 28, 1991 [JP] Japan ................... 3-055442

[51] Int. Cl.$^5$ .............................................. H01S 3/19
[52] U.S. Cl. ........................................ 372/45; 257/15; 257/17
[58] Field of Search ................. 372/45; 357/4, 17; 257/13-15, 17

[56] References Cited

U.S. PATENT DOCUMENTS

| 5,091,756 | 2/1992 | Iga et al. | 372/45 |
| 5,146,295 | 9/1992 | Imanaka et al. | 372/45 |

FOREIGN PATENT DOCUMENTS

| 0284031A2 | 9/1988 | European Pat. Off. | |
| 0172483 | 7/1988 | Japan | 372/45 |
| 0120888 | 5/1991 | Japan | 372/45 |

OTHER PUBLICATIONS

Takagi et al., "Potential Barrier Height Analysis of AlGaInP Multi-Quantum Barrier (MQB)"; Journal of Applied Physics, vol. 29, No. 11, Nov. 1990, pp. L1977-L1980.

Shealy, "High-efficiency superlattice graded-index separate confining heterostructure lasers with AlGaAs single quantum wells", App. Phys. Lett. 51(18), May 2, 1988, pp. 1455-1457.

Iga et al., "Electron Reflectance of Multiquantum Barrier (MQB)", Electronics Letters, vol. 22, No. 19, Sep. 11, 1986, pp. 1008-1010.

Patent Abstracts of Japan, vol. 12, No. 244, (E-631) Jul. 9, 1988. (Abstract of JP63032987).

Patent Abstracts of Japan, vol. 12, No. 261, (E-636)(3108) Jul. 22, 1988. (Abstract of JP-63-46788).

Primary Examiner—Georgia Y. Epps
Attorney, Agent, or Firm—Fish & Richardson

[57] ABSTRACT

A semiconductor luminous element has cladding layers on both sides of its active layer; and it has a multi-quantum barrier layer which is in contact with the active layer on at least a portion of at least one of the cladding layers. This multi-quantum barrier layer is formed of an alternating stack of superlattice barrier layers and superlattice well layers. The energy gap of the well layers is smaller than that of the active layer, and the quantized energy gap of the multi-quantum barrier layer is larger than the energy gap of the active layer. A superlattice structure for semiconductor devices, which confines electrons and holes, is formed out of the active layer and a cladding layer provided on at least one side of that active layer. A multi-quantum barrier layer is in contact with the active layer on at least a portion of the cladding layer. This multi-quantum barrier layer is formed of an alternating stack of superlattice barrier layers and superlattice well layers. The energy gap of the well layers is smaller than that of the active layer, and the quantized energy gap of the multi-quantum barrier layer is larger than the energy gap of the active layer.

10 Claims, 5 Drawing Sheets

SEMICONDUCTOR LUMINOUS ELEMENT AND SUPERLATTICE STRUCTURE

This application is a file wrapper continuation of U.S. application Ser. No. 07/841,991, filed Feb. 27, 1992, now abandoned.

FIELD OF THE INVENTION

This invention relates to a structure for a superlattice, an arrangement to confine electrons or holes which employs this superlattice, and a semiconductor luminous element which employs this arrangement.

BACKGROUND OF THE INVENTION

In semiconductor luminous devices like semiconductor lasers and light-emitting diodes, a double heterostructure is often used to efficiently confine within the active region the electrons or holes which are injected, so as to maximize the luminescence. The injected carriers are confined by the potential barrier in the hetero junctions between the active layer and the cladding layers.

The height of this potential barrier is essentially determined by the physical constants of the semiconductor materials of which the active and cladding layers are formed. It will assume a value corresponding to the difference between the energy gap of the cladding layers and that of the active layer. The luminescent wavelength can be shortened by increasing the energy gap of the active layer. When this is done, however, there is no way to increase the potential barrier, so the carriers cannot be sufficiently confined.

To address this problem, a multi-quantum barrier (or MQB) has been proposed which makes use of the wave-like character of electrons. See Laid-Open Japanese Patent Application No. 63-46788. The thickness of each layer is chosen so as to form a multi-quantum barrier. The electron waves reflected by each hetero surface of a multi-quantum barrier interfere with and reinforce each other. In this way the reflectivity of electrons leaking from the active layer to the cladding layer can be increased. Thus an MQB offers the possibility of raising the potential barrier while sufficiently confining the carriers within the active layer.

However, if the energy gap of the active layer is increased still more, the virtual potential barrier cannot be increased using a multi-quantum barrier.

The height of the virtual potential barrier produced by a multi-quantum barrier as mentioned above is strongly dependent on the potential difference between the well and barrier layers of the superlattice. This potential difference is the difference within the discontinuous energy band which appears at the lower edge of the conductive band. This band is shown as $U_0$ in FIG. 2(A). The larger this difference, the higher the virtual potential barrier will be.

In the existing multi-quantum barriers described above, the same material was used as the semiconductor in the well layers and the active layer, thus causing their energy gaps to be equal. If the energy gap of the active layer were made larger, that of the well layers would also increase, and the potential difference between the well and barrier layers within the multi-quantum barrier which constituted the virtual potential barrier would decrease. This appears to be a reason why the virtual potential barrier cannot be increased above a certain level by the multi-quantum barrier. As a result, the degree to which the potential barrier could be increased using a multi-quantum barrier was limited.

SUMMARY OF THE INVENTION

This invention makes it possible to maintain a high virtually augmentable potential barrier using an MQB even when the active layer has a high energy gap. This is achieved by the semiconductor luminous element of this invention, which is distinguished by the following elements: It has cladding layers on both sides of its active layer; and it has a multi-quantum barrier layer which is in contact with the active layer on at least a portion of at least one of the cladding layers. This multi-quantum barrier layer is formed of an alternating stack of superlattice barrier layers and superlattice well layers. The energy gap of the well layers is smaller than that of the active layer, and the quantized energy gap of the multi-quantum barrier layer is larger than the energy gap of the active layer.

The structure of this invention by which the electrons and holes are confined is formed from the active layer and the cladding layer provided on at least one side of that active layer. A multi-quantum barrier layer is in contact with the active layer on at least a portion of the cladding layer. This multi-quantum barrier layer is formed of an alternating stack of superlattice barrier layers and superlattice well layers. The energy gap of the well layers is smaller than that of the active layer, and the quantized energy gap of the multi-quantum barrier layer is larger than the energy gap of the active layer.

It is desirable that the energy gap of the barrier layers in the multi-quantum barrier be larger than that of the active layer. It is also desirable that a layer to prevent resonant tunnelling be provided between the active layer and the multi-quantum barrier layer.

The structure of the superlattice of this invention is formed from alternating layers of at least two types of crystals which have different energy gaps. The energy gap of the crystal having the smaller of the two energy gaps is smaller than that of the material on the side into which electrons or holes can enter, and the thickness and structure of these crystals is such that the phases of reflected waves from electrons or holes which entered them lead to mutual reinforcement. As a result, the quantized energy gap of the superlattice structure as a whole is larger than that of the material on the side where the electron or hole enters.

A different material is used for the semiconductor in the well layers of the multi-quantum barrier than that in the active layer so that the energy gap of the well layers is smaller than that of the active layer. In this way, the difference between the energy gaps of the well and barrier layers of the MQB can be enhanced. At the same time, the height of the virtual potential barrier which can be raised by the MQB can be increased. The well and barrier layers which comprise the multi-quantum barrier are formed and their thickness is chosen so that the quantized energy gap of the MQB will be larger than that of the active layer. This ensures that the light emitted by the active layer will not be absorbed by the multi-quantum barrier.

As explained above, existing multi-quantum barriers cannot form high enough potential barriers if the active layer has such a large energy gap. This invention makes it possible to create a sufficiently high potential barrier without loss of efficiency due to absorption and thus to confine the carriers suitably within the active layer of such an element.

DETAILED DESCRIPTION OF THE INVENTION

We shall now discuss an embodiment in which this invention is employed in an AlGaInP semiconductor laser emitting visible light.

Figure 1:
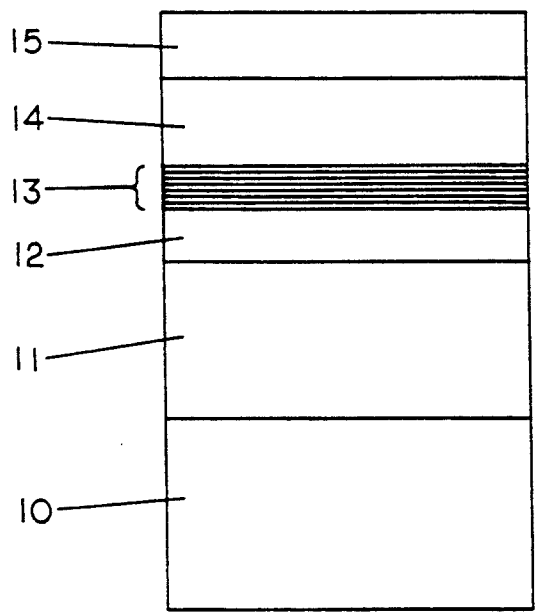
FIG. 1 shows the structure of an AlGaInP semiconductor laser in which this invention has been implemented.

FIG. 1 shows the structure of an AlGaInP semiconductor laser. In this laser, n-AlGaInP cladding layer 11, AlGaInP active layer 12, p-AlGaInP cladding layer 14, and p-GaAs cap layer 15 are formed successively on n-GaAs substrate 10. MQB layer 13, which serves to reinforce the confinement of electrons, is created on a portion of p-cladding layer 14 in a location where it can make contact with active layer 12. A semiconductor laser of this construction can be manufactured using a process such as the MBE method or the MOCVD method.

Figure 2A:
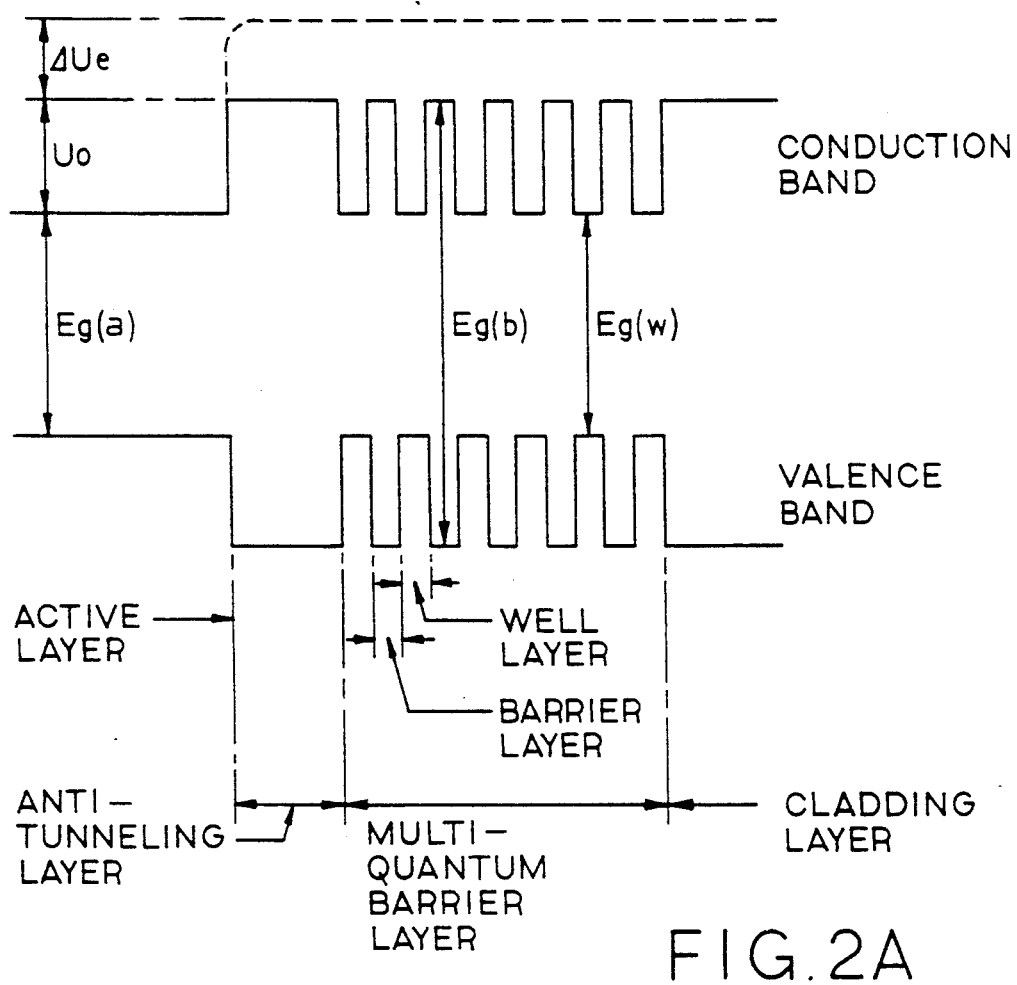
FIG. 2(A) shows the profile of an existing MQB, and FIG. 2(B) the profile of the MQB of this invention.
Figure 2B:
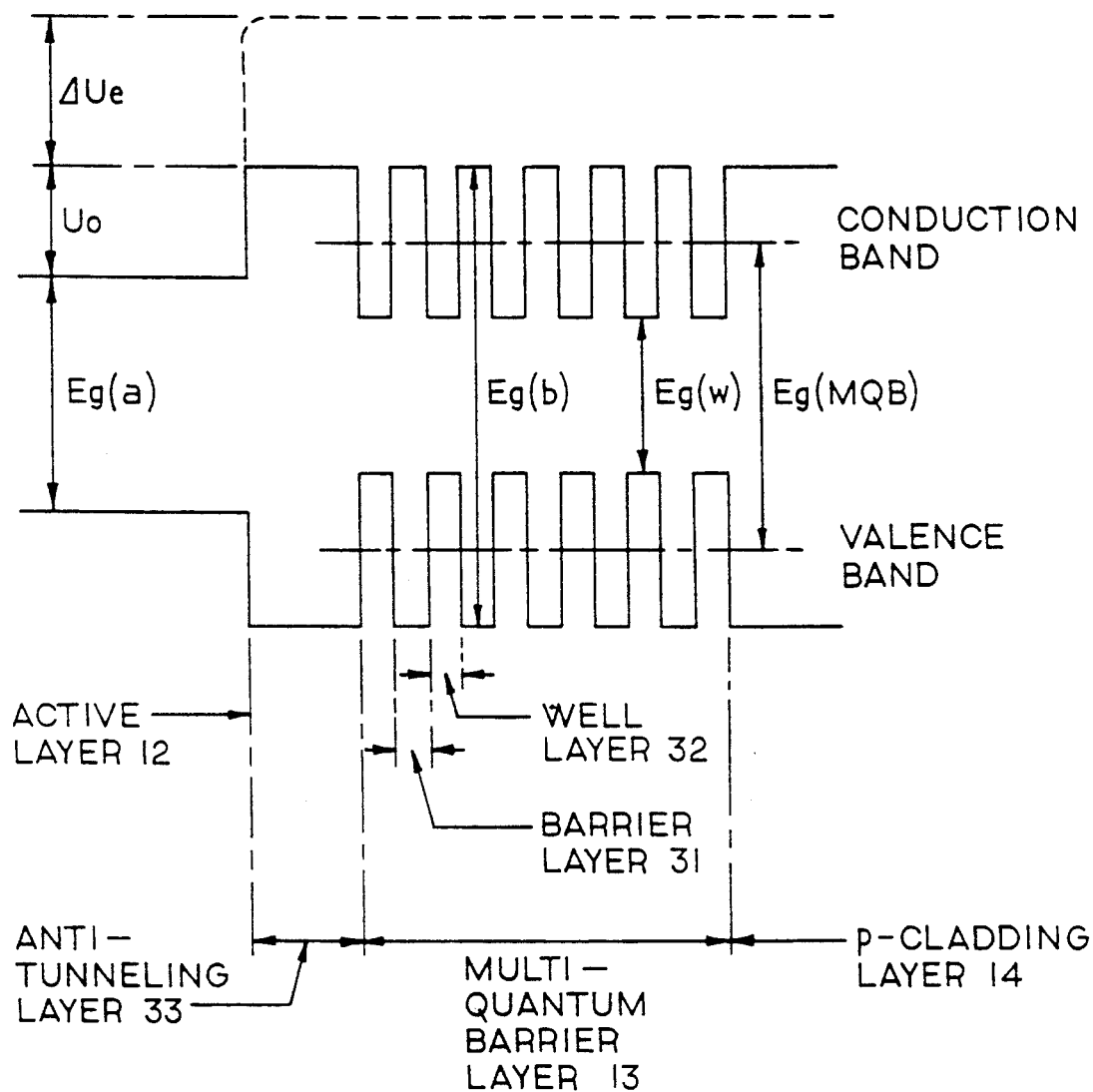
FIG. 2 shows potential profiles in the vicinity of the multi-quantum barrier layer.

FIG. 2 shows the potential profile of the laser of FIG. 1 in the vicinity of the MQB layer. FIG. 2(A) shows, for purposes of comparison with the embodiment of this invention, the MQB layer described in the Laid-Open Japanese Patent Application No. 63-46788 (hereafter called the existing MQB). FIG. 2(B) shows the MQB layer in the embodiment of the invention described herein (hereafter called the MQB of this invention).

In FIG. 2(A), the energy gap of the active layer is labeled Eg (a), that of the barrier layers in the superlattice which forms the MQB layer is labeled Eg (b), and that of the well layers in the same superlattice is labeled Eg (w). The item labeled $U_o$ is the potential energy difference on the lower edge of the conductive band between the barrier and well layers comprising the MQB layer (or the potential energy difference on the lower edge of the conductive band between the active layer and the barrier layers within the MQB). The virtual potential barrier created by the MQB layer is shown as a dotted line. $\Delta U_e$ is the portion of that barrier whose increase is dependent on the MQB. $\Delta U_e$ increases depending on the increase of potential difference $U_o$ as an exponential function. (See FIG. 4)

As discussed above, designers of existing semiconductor luminous elements with an MQB layer paid no particular attention to the relationship between the material used as a semiconductor in the active layer and that in the barrier and well layers comprising the MQB layer. As a result, the same semiconductor material was often used in the active and well layers, so that Eg (a) would be identical to Eg (w). Thus when the energy gap Eg (a) of the active layer was increased, the energy difference between Eg (b) and Eg (w) would decrease. Potential energy difference $U_o$ would decrease, and consequently the augmentable portion $\Delta U_e$ of the potential barrier would decrease as an exponential function.

This invention concerns a semiconductor luminous element with an MQB layer. It sets certain restrictions on the materials which can be used as the semiconductors in the active layer and the materials of the barrier and well layers of the superlattice comprising the MQB layer, in order to maintain a fixed relationship between the energy gaps of those layers. In the following section, we shall give a detailed explanation of that fixed relationship.

As shown in FIG. 2(B), MQB layer 13 is composed of a stack of alternating layers of superlattice barriers 31 and superlattice wells 32. These barriers and wells should each be from 5 to 50 Å thick, as explained in detail below, and a total of ten layers should suffice. Layer 33, 100 to 200 Å thick, is provided between active layer 12 and MQB layer 13 to prevent resonant tunnelling. This layer prevents leakage of electrons from active layer 12 resulting from the tunnel effect. Anti-tunnelling layer 33, superlattice barrier layer 31 and p-cladding layer 14 may all be composed of the same semiconductor material, or they may be composed of different materials.

In order to increase the energy gap between superlattice well layers 32 and barrier layers 31 in MQB layer 13, and to raise the virtually augmentable potential barrier created by the MQB, this invention uses a material for well layers 32 in MQB layer 13 which has a smaller energy gap than active layer 12. That is to say, the material for each of the layers is selected so as to satisfy the following formula 1, where Eg (a) is the energy gap of active layer 12, Eg (w) is the energy gap of superlattice well layer 32 in MQB layer 13 and Eg (b) is the energy gap of superlattice barrier layer 31 in MQB layer 13.

$$\text{Eg (w)} < \text{Eg (a)} < \text{Eg (b)} \qquad (1)$$

For example, one composition which would establish the relationship xw<xa<xb would be to use $(Al_{xa}Ga_{1-xa})_{0.5}In_{0.5}P$ for active layer 12; $(Al_{xw}Ga_{1-xw})_{0.5}In_{0.5}P$ for well layer 32 in MQB layer 13; and $(Al_{xb}Ga_{1-xb})_{0.5}In_{0.5}P$ for barrier layer 31 in MQB layer 13.

With this type of energy ranking relationship, the composition and thickness of well layers 32 and barrier layers 31 in MQB layer 13 must be chosen to insure that the light emitted by active layer 12 is not absorbed by the MQB layer.

The conditions to insure that the light emitted by active layer 12 is not absorbed by MQB layer 13 are expressed by the following formula 2, where Eg (MQB) is the quantized energy gap of MQB layer 13.

$$\text{Eg (MQB)} > \text{Eg (a)} \qquad (2)$$

The quantized energy gap Eg (MQB) of MQB layer 13 is determined by the materials used for the well layers 32 and barrier layers 31 which comprise it as well as their thickness (or width).

Figure 3:
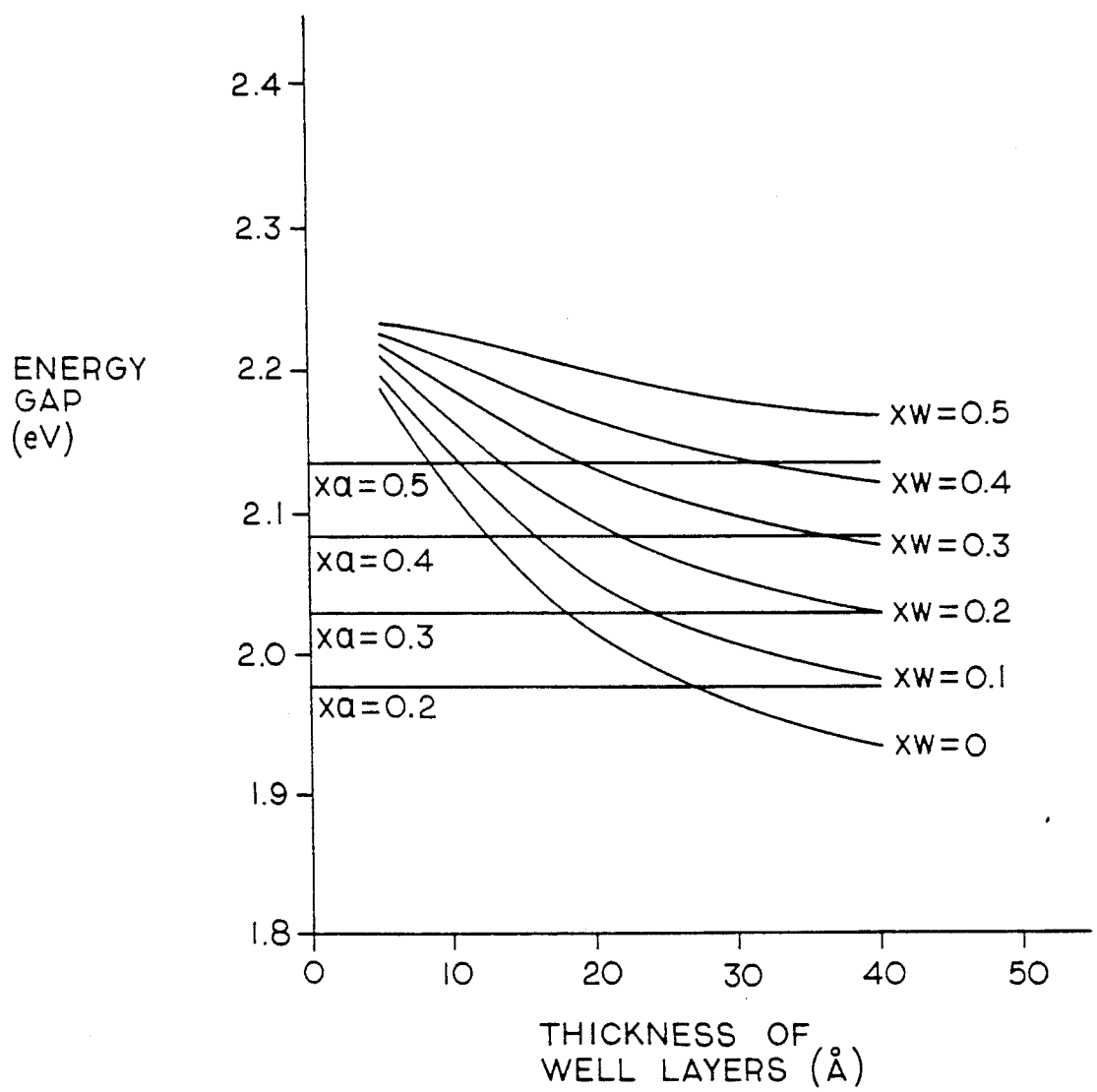
FIG. 3 is a graph which illustrates the relationship between the depth of the wells and the quantized energy gap.

FIG. 3 is a graph illustrating how the quantized energy gap in a single-quantum well structure varies with the thickness and composition of the well layer. A model of a single-quantum well is used in which the well layer is composed of $(Al_{xw}Ga_{1-xw})_{0.5}In_{0.5}P$. Barrier layers of infinite thickness on both sides of the well layer are composed of $(Al_{0.7}Ga_{0.3})_{0.5}In_{0.5}P$. The thickness of the well layer is shown on the horizontal axis, the quantized energy gap on the vertical axis. The proportion of Al in the composition is expressed as the parameter xw. The six curves were calculated for these values for xw: 0, 0.1, 0.2, 0.3, 0.4 and 0.5. The energy gap of an active layer composed of $(Al_{xa}Ga_{1-xa})_{0.5}In_{0.5}P$ is also shown for the values xa=0.2, 0.3, 0.4 and 0.5. From this graph we can deduce how thick the well layer should be in order to satisfy Formula 2.

The reflectivity with respect to electron waves was calculated for an MQB layer which would have a composition and thickness such that it would not absorb the emitted light. The calculation was done using the same technique as indicated in T. Takagi, F. Koyama, and K. Iga, "Potential Barrier Height Analysis of AlGaInP Multi-Quantum Barriers (MQBs)," *Japan Journal of Applied Physics*, 29, L1977 (1990). The results in FIG. 4 show the augmentable portions $\Delta U_e$ of the height of a virtual potential barrier with a reflectivity of at least 99%.

Figure 4:
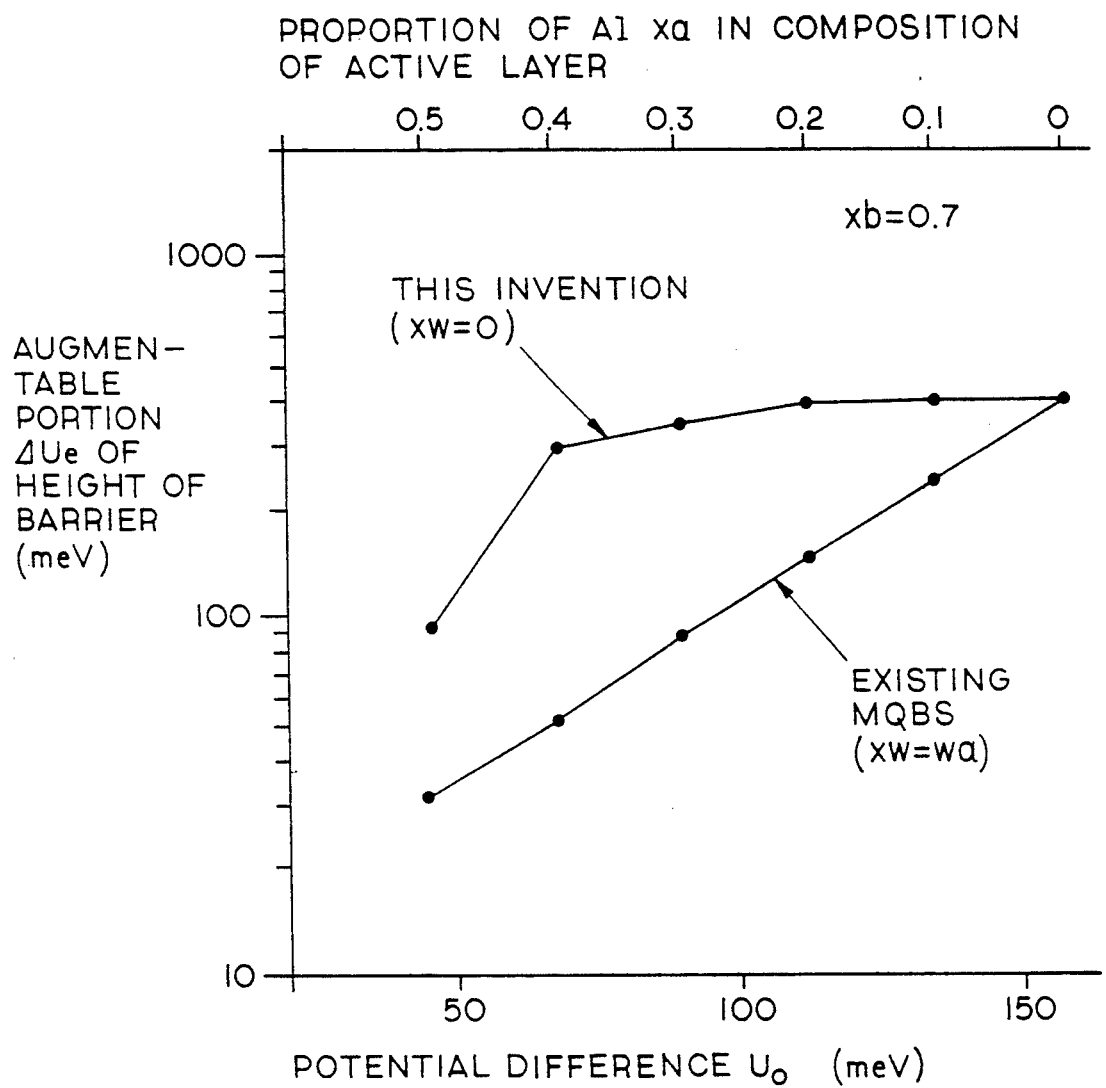
FIG. 4 is a graph which illustrates the relationship between the potential difference and the augmentable portion of the height of the potential barrier.

FIG. 4 shows a comparison of the MQB of this invention with existing MQBs. The horizontal axis represents the aforesaid potential energy difference $U_o$ and the proportion xa of Al in the composition of the active layer. The vertical axis is the augmentable portion $\Delta U_e$ of the height of the virtual potential barrier. Existing MQBs use a composition such that xw=xa; in the MQB of this invention, xw=0. The proportion of Al in the composition of the barrier, xb, is 0.7. The composition of the active layer, the well layers and the barrier layers are, respectively, $(Al_{xa}Ga_{1-xa})_{0.5}In_{0.5}P$, $(Al_{xw}Ga_{1-xw})_{0.5}In_{0.5}P$ and $(Al_{xb}Ga_{1-xb})_{0.5}In_{0.5}P$.

In existing MQBs, the augmentable portion $\Delta U_e$ of the potential barrier is strongly dependent on potential energy difference $U_o$. Portion $\Delta U_e$ will increase as an exponential function as the potential energy difference $U_o$ increases. Accordingly, as described above, if the energy gap of the active layer is increased and potential energy difference $U_o$ decreased, it becomes impossible to increase augmentable portion $\Delta U_e$. With the MQB of this invention, however, the augmentable portion $\Delta U_e$ of the height of the potential barrier can be 300 meV even if potential energy difference $U_o$ is small.

Figure 5:
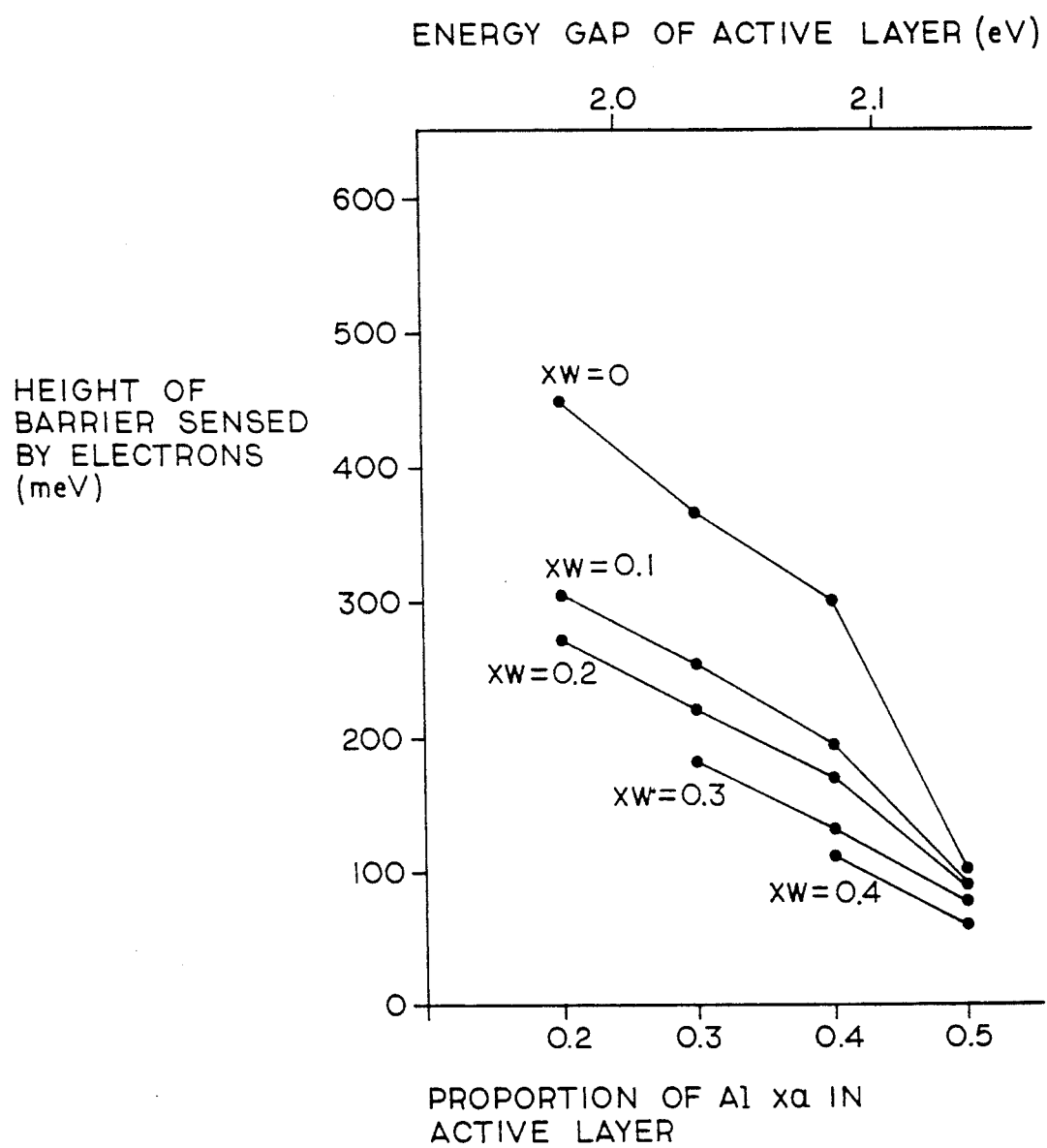
FIG. 5 is a graph which illustrates the relationship between the proportion of Al in the composition of the active layer and the height of the potential barrier as sensed by the electrons.

FIG. 5 shows the maximum values when xa and xw have been changed to respond to the height $U_a$ of the potential barrier which is sensed by the electrons within the active layer in light of the Fermi level of the holes in the MQB. This height $U_a$, the height of the potential barrier from the perspective of the electrons, can be expressed by the following formula 3.

$$Ua = \Delta Eg + \Delta U_e - (Efp - Ev), \quad (3)$$

wherein, as shown in Formula 4:

$$\Delta Eg = Eg(c) - Eg(a) \quad (4)$$

Eg(c) is the energy gap of the p-cladding layer; Efp is the Fermi level of the holes in the MQB layer; and Ev is the energy level at the upper edge of the valence band in the p-cladding layer.

In the calculations used to create the graph, the density of the carriers in the p-cladding layer was set at $1 \times 10^{18} cm^{-3}$, and xb was set at 0.7.

If we increase the proportion xa of the Al content in the active layer and so increase the energy gap of that layer, the height $U_a$ of the potential barrier will decrease. This happens because $\Delta Eg$ itself decreases, and because the combination of wells and barriers which will not allow absorption of the emitted light is limited. If an MQB is used which has a small xw, while the proportion of Al in the active layer remains the same, a large $U_a$ can be obtained. If xa=0.4 (with a wavelength λ of approximately 600 nm), a $U_a$ of at least 200 meV can be obtained in an MQB with an xw of 0 (a well of 11.3 Å and a barrier of 11.3 Å) or an xw of 0.1 (a well of 14.2 Å and a barrier of 11.3 Å). This value suggests that stable CW (continuous wave) operation can be obtained even in an AlGaInP laser at the 600 nm band.

In the embodiment described above, an MQB layer was introduced into the p-cladding layer to confine electrons within the active layer. It would, of course, also be possible to introduce an MQB layer into the n-cladding layer in order to enhance the effectiveness of confinement of the holes within the active layer. Careful consideration should be paid to the potential energy difference $\Delta Ev$, which is based on band discontinuity in the valence band, and to the effective mass of the holes. The MQB layer can be constituted just as described above, and it should be introduced as part of the n-cladding layer in a location in which it can make contact with the active layer.

This invention is not limited to the form espoused in the embodiment; various alterations can be made in it. It would, for example, be possible to use mixed crystal materials such as $Ga_{1-x}Al_xAs$ or GaAlAsSb. In the embodiment, a structure was used in which two layers were repeatedly stacked; however, it would also be possible to use a superlattice structure in which three or more crystals were repeatedly stacked.

What is claimed is:

1. A semiconductor luminous element, comprising an active layer having two sides, cladding layers disposed on both sides of the active layer and a multi-quantum barrier layer which is in contact with the active layer and at least a portion of at least one of the cladding layers, wherein the multi-quantum barrier layer comprises an alternating stack of superlattice barrier layers and superlattice well layers, the superlattice well layer having an energy gap smaller than an energy gap of the active layer and the multi-quantum barrier layer having a quantized energy gap larger than the energy gap of the active layer.

2. The semiconductor luminous element according to claim 1, wherein the superlattice barrier layer within the multi-quantum barrier layer has an energy gap which is larger than the energy gap of the active layer.

3. The semiconductor luminous element according to claim 1, further comprising an anti-tunneling layer disposed between the active layer and the multi-quantum barrier layer which prevents resonant tunneling between the active layer and the multi-quantum barrier layer.

4. The semiconductor luminous element according to claim 2, further comprising an anti-tunneling layer disposed between the active layer and the multi-quantum barrier layer which prevents resonant tunneling between the active layer and the multi-quantum barrier layer.

5. A structure for confining electrons and holes in a semiconductor element, comprising an active layer having two sides, one or more cladding layers disposed on at least one side of the active layer and a multi-quantum barrier layer which is in contact with the active layer and at least a portion of at least one of the cladding layers, wherein the multi-quantum barrier layer comprises an alternating stack of superlattice barrier layers and superlattice well layers, the superlattice well layer having an energy gap smaller than an energy gap of the active layer and the multi-quantum barrier layer having a quantized energy gap larger than the energy gap of the active layer.

6. The structure for confining electrons and holes in a semiconductor element according to claim 5, wherein the superlattice barrier layers within the multi-quantum barrier layer have an energy gap which is larger than the energy gap of the active layer.

7. The structure for confining electrons and holes in a semiconductor element according to claim 5, further comprising an anti-tunneling layer disposed between the active layer and the multi-quantum barrier layer which prevents resonant tunneling between the active layer and the multi-quantum barrier layer.

8. The structure for confining electrons and holes in a semiconductor element according to claim 6, further comprising an anti-tunneling layer disposed between the active layer and the multi-quantum barrier layer which prevents resonant tunneling between the active layer and the multi-quantum barrier layer.

9. A superlattice structure, comprising alternating layers of at least two types of crystals having different energy gaps, wherein the energy gaps of adjacent crystal layers are such that the type of crystal having the smaller energy gap of the adjacent layers has an energy gap which is smaller than that of a portion of the superlattice structure on a side through which electrons or holes enter the superlattice structure, and wherein the thicknesses and structures of the adjacent crystal layers are such that phases of reflected waves from the electrons or holes entering the superlattice structure mutually reinforce.

10. The superlattice structure according to claim 9, wherein the superlattice structure has a quantized energy gap which is greater than the energy gap of the portion of the superlattice structure on the side through which electrons or holes enter the superlattice structure.

* * * * *